(12) United States Patent
Graef

(10) Patent No.: US 6,305,001 B1
(45) Date of Patent: *Oct. 16, 2001

(54) CLOCK DISTRIBUTION NETWORK PLANNING AND METHOD THEREFOR

(75) Inventor: Stefan Graef, Milpitas, CA (US)

(73) Assignee: LSI Logic Corporation, Milpitas, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/099,287

(22) Filed: Jun. 18, 1998

(51) Int. Cl.$^7$ ...................................................... G06F 17/50
(52) U.S. Cl. .................................... 716/12; 2/6; 2/7; 2/10
(58) Field of Search .......................... 395/500.13; 716/12

(56) References Cited

U.S. PATENT DOCUMENTS

| | | | |
|---|---|---|---|
| 4,769,558 | * 9/1988 | Bach | 307/269 |
| 5,109,168 | * 4/1992 | Rusu | 307/480 |
| 5,140,184 | * 8/1992 | Hanamoto et al. | 307/303.1 |
| 5,293,626 | * 3/1994 | Priest et al. | 713/401 |
| 5,481,573 | * 1/1996 | Jacobowitz et al. | 375/356 |
| 5,557,779 | * 9/1996 | Minami | 395/500 |
| 5,578,945 | * 11/1996 | Flora | 326/93 |
| 5,608,645 | * 3/1997 | Spyrou | 364/491 |
| 5,638,291 | * 6/1997 | Li et al. | 364/490 |
| 5,686,845 | * 11/1997 | Erdal et al. | 326/93 |
| 5,784,600 | * 7/1998 | Doreswamy et al. | 395/558 |
| 5,812,416 | * 9/1998 | Gupte et al. | 364/490 |
| 5,963,728 | * 10/1999 | Hathaway et al. | 395/500.04 |
| 5,987,576 | * 11/1999 | Johnson et al. | 711/167 |
| 6,125,217 | * 9/2000 | Paniccia et al. | 385/14 |

OTHER PUBLICATIONS

J. Lipman, "Growing Your Own IC Clock Tree", EDN Electrical Design News, vol. 42, pp. 40–46, 48, Mar. 1997.*
K. Yip, "Clock Tree Distribution", IEEE Potentials, vol. 16, No. 2, pp. 11–14, Apr. 1997.*

\* cited by examiner

*Primary Examiner*—Matthew Smith
*Assistant Examiner*—A. M. Thompson

(57) ABSTRACT

A method for planning the clock distribution network in the conceptual design phase of an ASIC device is provided herein that comprises partitioning the technology-independent description of the device into partitioned groups based on the clocking time of the clock recipients in each of the partitioned groups. In addition, a clock budgeting plan is generated by creating target timing groups and assigning each of the partitioned groups to one of the target timing groups based on the clocking time of the clock recipients in each of the partitioned groups. The clock recipients in each of the target timing groups clock at a substantially same time and clock recipients in different target groups clock at different times. The clock distribution network is created based on the clock budgeting plan such that the clock distribution network provides a clock signal to clock recipients in each of the target timing groups in a manner that the clock recipients in each of the target timing groups are clocked together at a substantially same time.

54 Claims, 7 Drawing Sheets

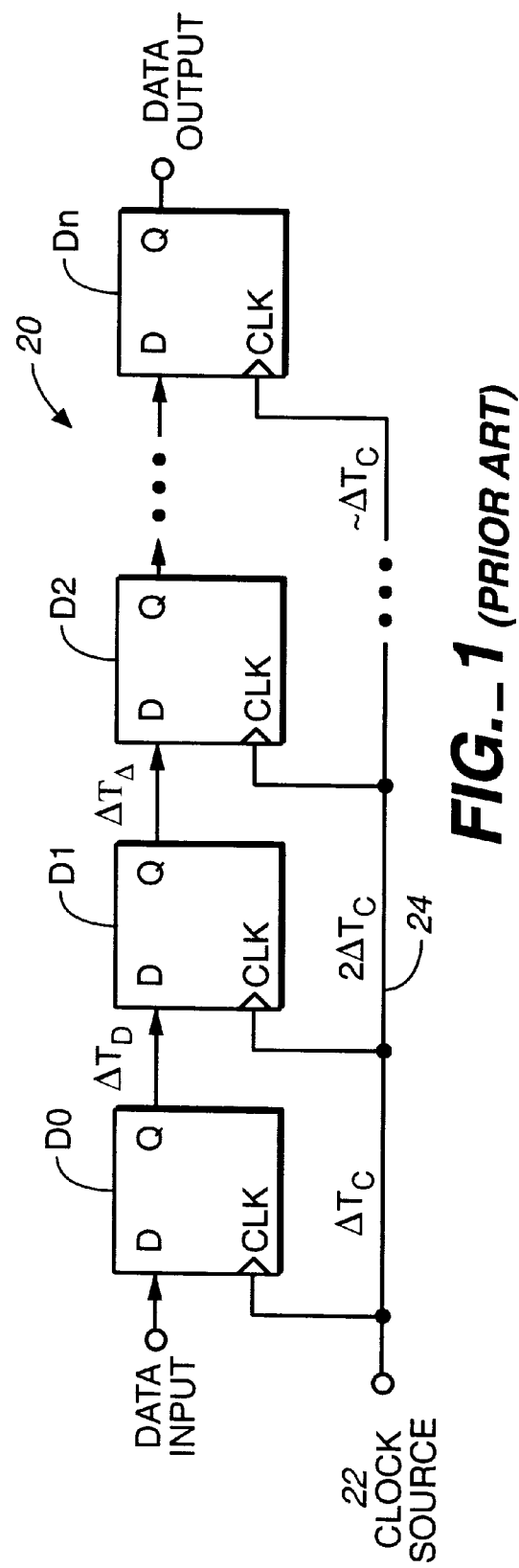
FIG._1 *(PRIOR ART)*

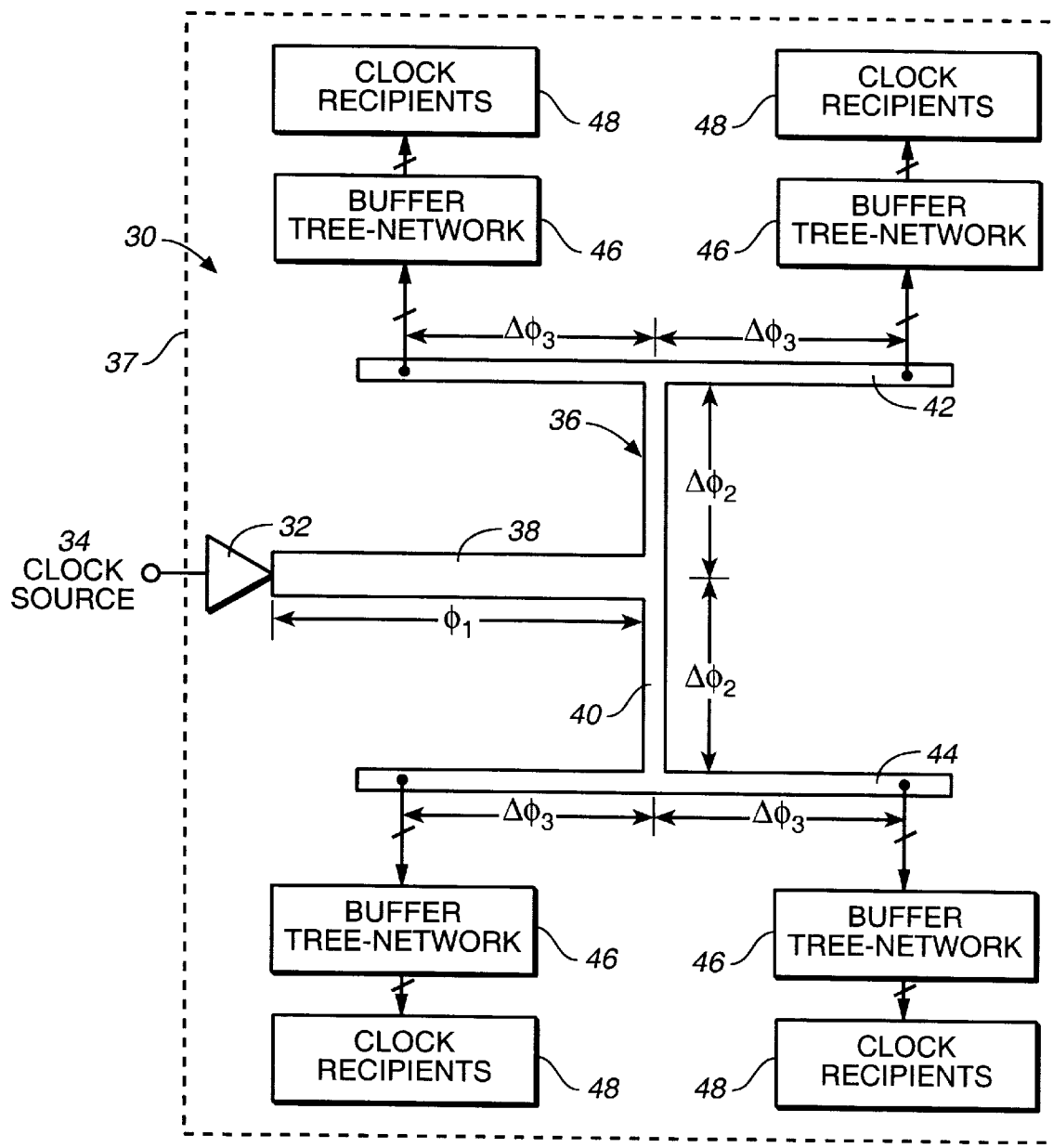
FIG._2
*(PRIOR ART)*

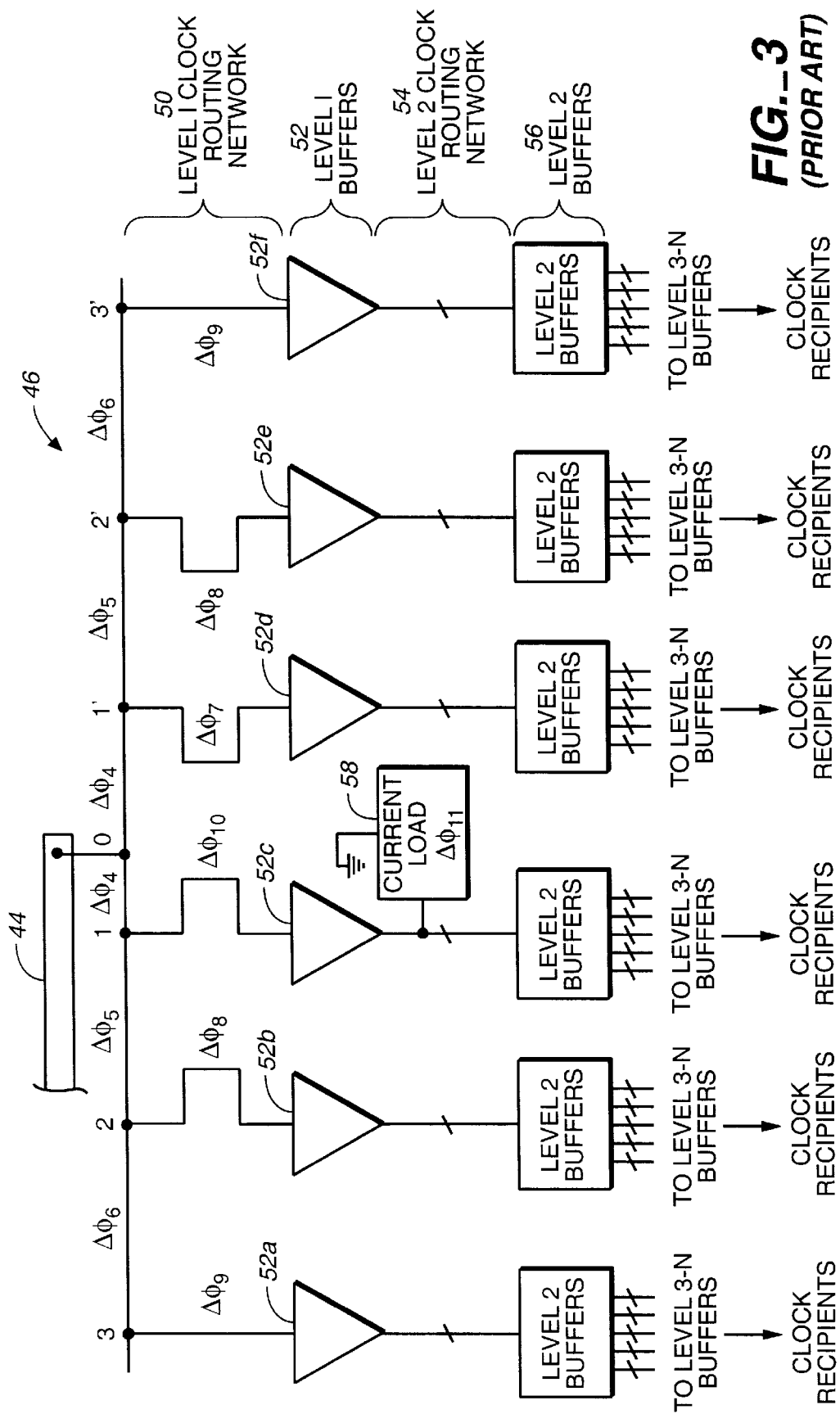
FIG._3 *(PRIOR ART)*

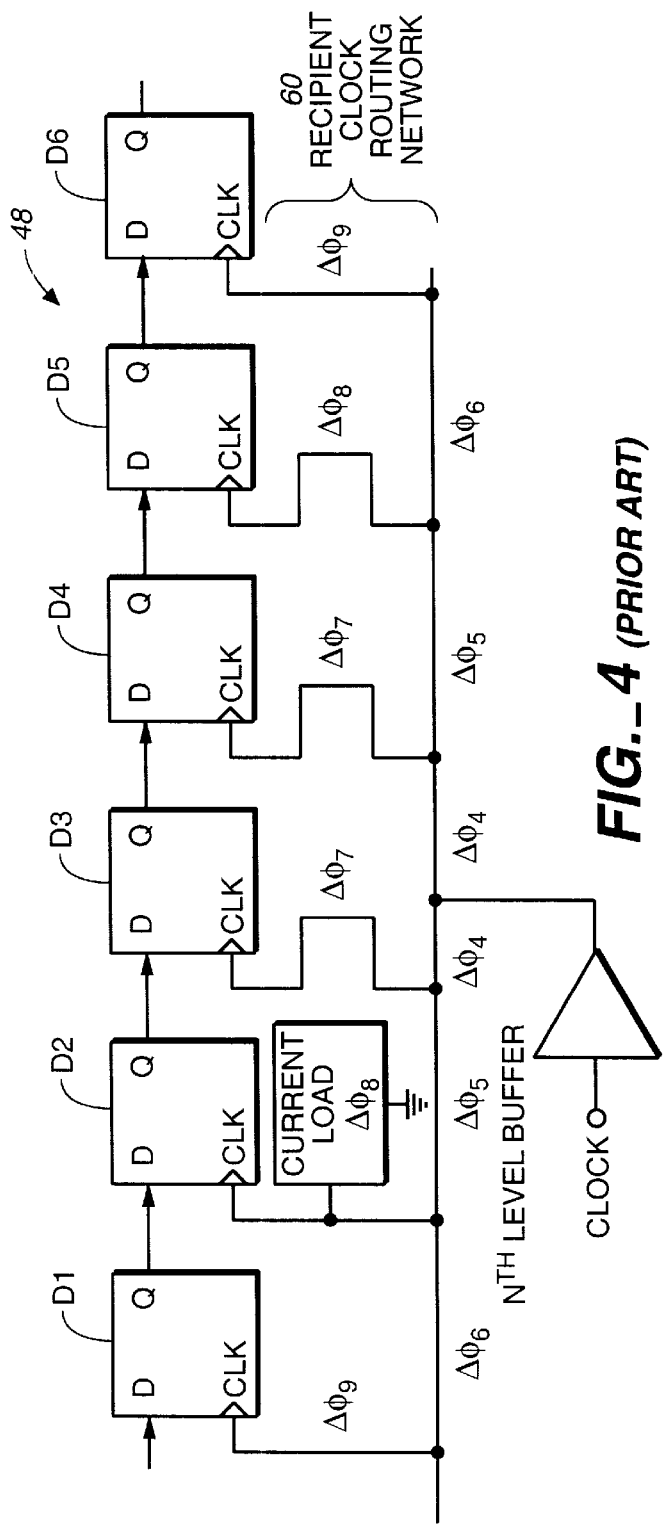
FIG._4 (PRIOR ART)
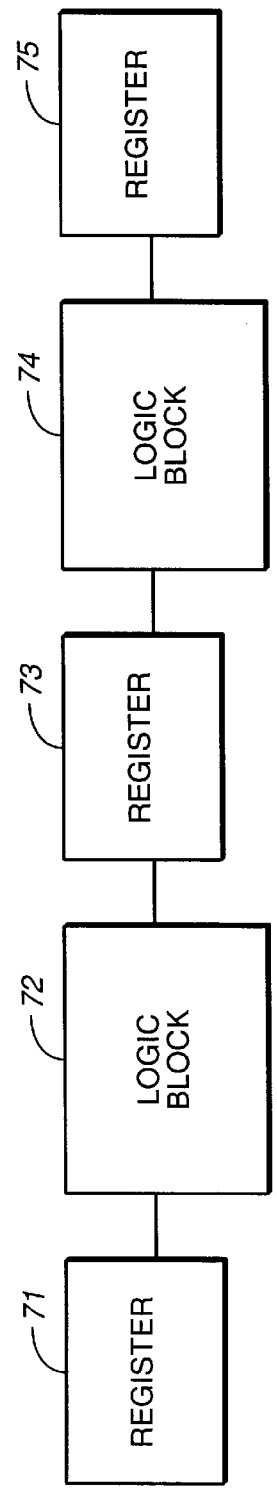
FIG._5

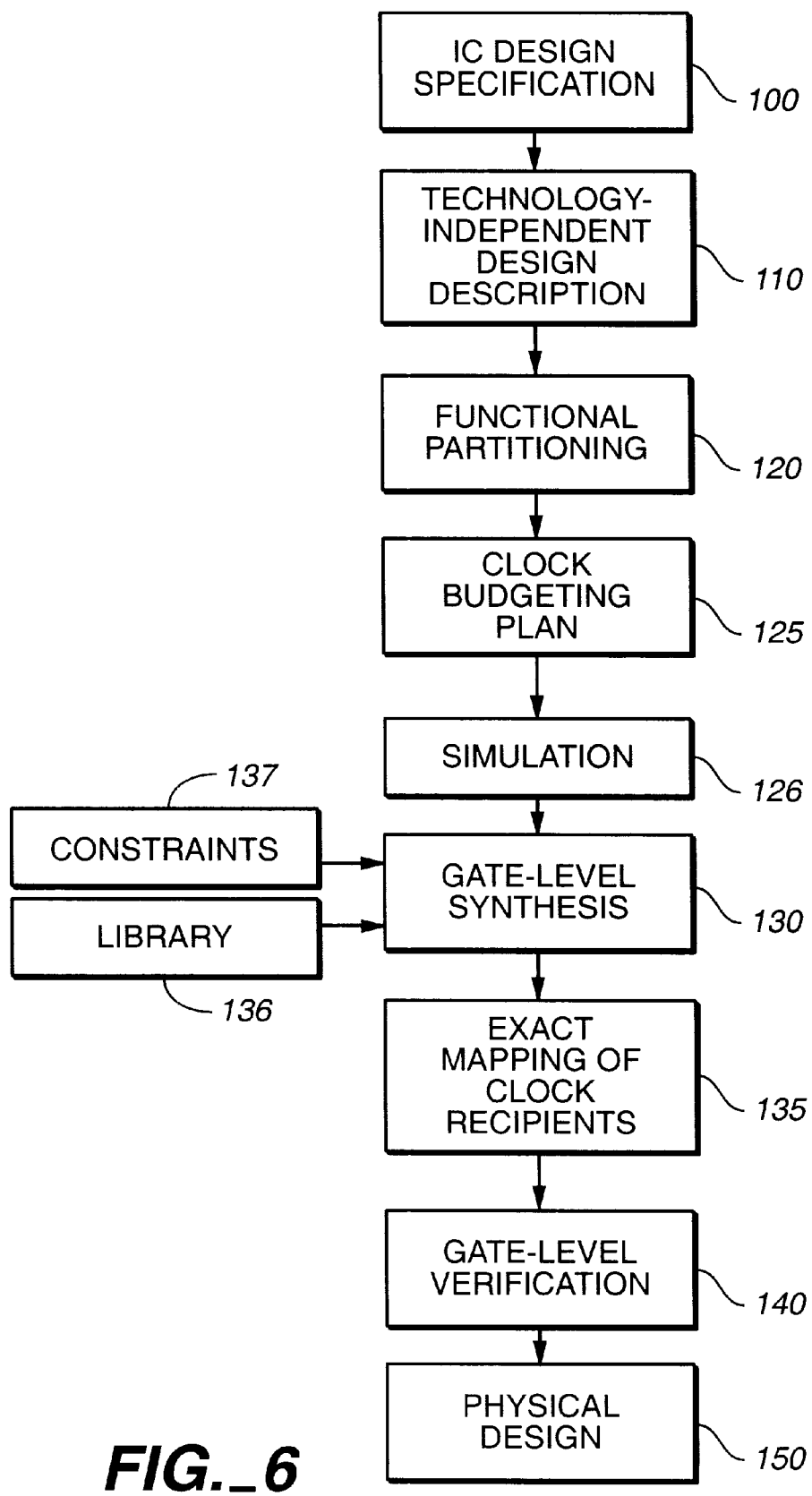
FIG._6

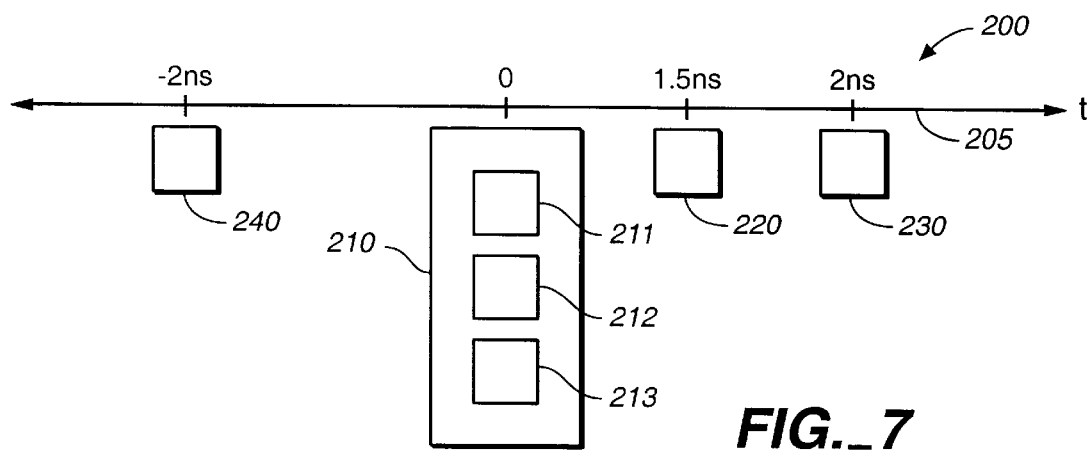
FIG._7
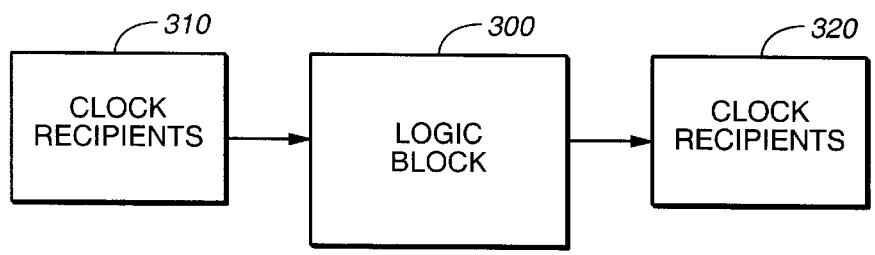
FIG._8
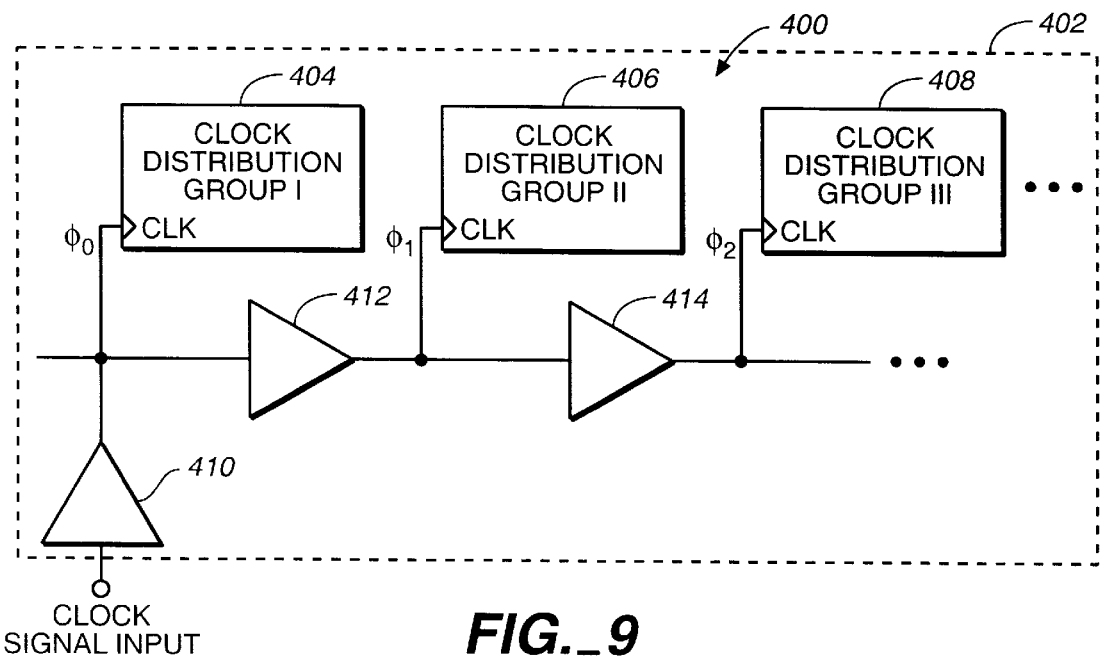
FIG._9

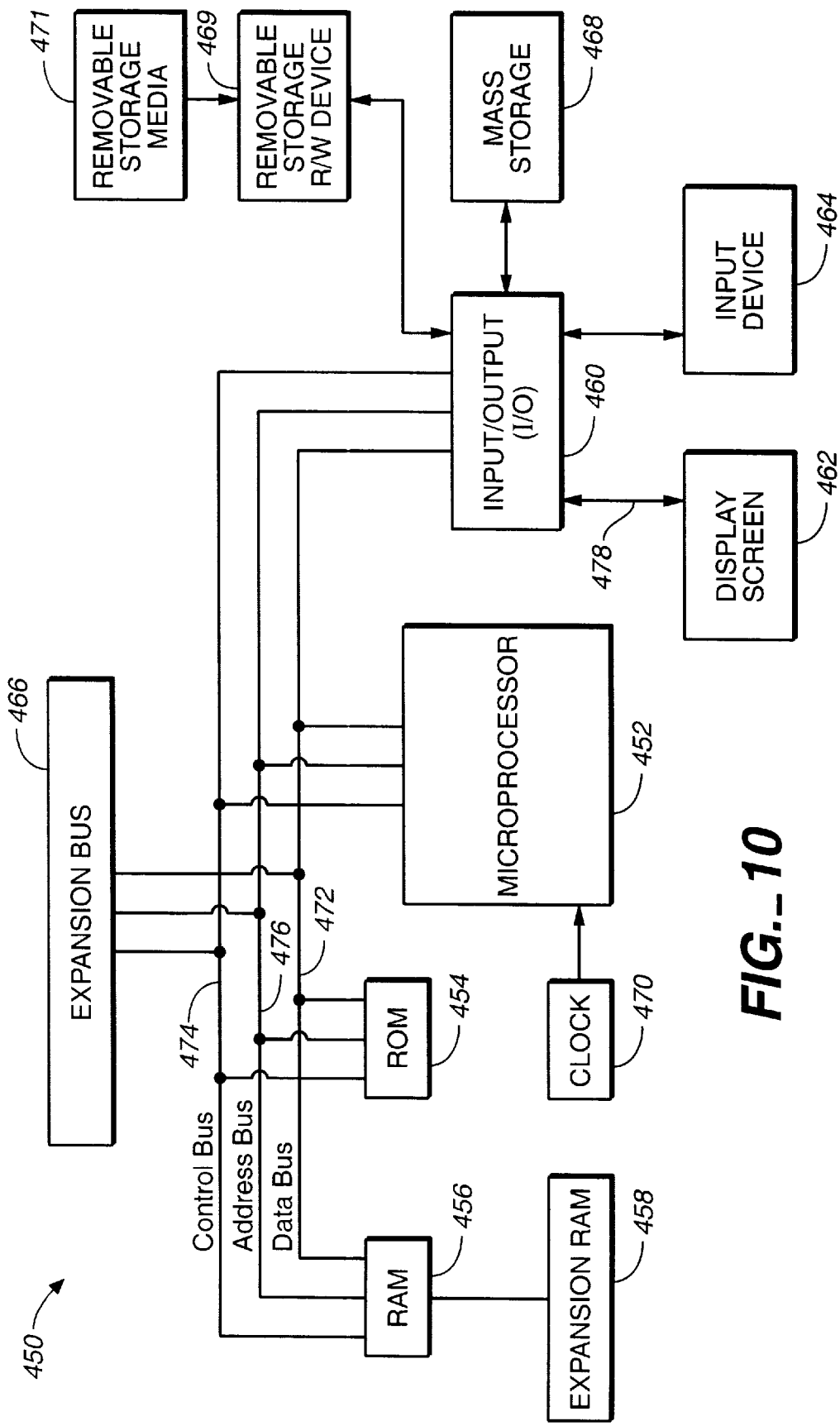
FIG._10

US 6,305,001 B1

CLOCK DISTRIBUTION NETWORK PLANNING AND METHOD THEREFOR

BACKGROUND OF THE INVENTION

1. Field of the Invention

This invention relates generally to clock distribution network planning for ASICs, and in particular, to methods and computer-aided design tools for planning the clock distribution network in the conceptual design phase of the ASIC devices to reduce clock skew, ground bounce, VDD noise and idle clock cycle time.

2. Description of the Related Art

The routing and distribution of the clock to elements of an integrated circuit, or more specifically, an application specific integrated circuit (ASIC), is an important factor to consider in the design of ASICs. To take an analogy, for instance, the clock of an ASIC may be seen as the heart and blood flow of a human body, whereas the clock routing and distribution of an ASIC may be seen as the arteries and veins of a human body. Just like the human body requires that the arteries and veins be properly distributed in order for each organ to function properly and together with other organs, the clock routing and distribution of an ASIC should be designed so that the clock-receiving elements function properly and together so that the intended functions of the ASIC are achieved. One of the intended functions of clock recipient elements of an ASIC, for example, is to propagate data to an intended functional destination of an ASIC.

Referring to FIG. 1, a simple prior art chain of D-type flip-flops 20 is shown, wherein the D flip-flops (D0–Dn) are shown sequentially cascaded together to propagate data from a data input to a data output. As it is conventionally known of these types of data-propagating chains of D-type flip-flops, the Q-output of one of the flip-flops in the chain is coupled to the D-input, of the next flip-flop in the chain in the direction in which data propagates. Thus, in the example shown in FIG. 1, the Q-output of flip-flop D0 is coupled to the D-input of flip-flop D1; the Q-output of flip-flop D1 is coupled to the D-input of flip-flop D2; and so on. The chain of D flip-flops are driven by a common clock source 22 by way of a clock distribution network 24. In the example shown in FIG. 1, the clock distribution network 24 includes an input for the clock source 22 situated near the flip-flip D0, and extends therefrom parallel with the flip-flops in the direction of data propagation, and includes a branch to each of the clock inputs of the flip-flops in the chain 20.

In operation, a clock pulse or triggering edge of the clock causes each of the D flip-flops in the chain 20 to propagate data from its D-input to its Q-output. Each consecutive clock pulse or triggering edge causes the data to move further down the chain of flip-flops. In the example shown in FIG. 1, per every clock pulse or triggering edge, data at the D-inputs of flip-flops D0–Dn propagates to the Q-outputs of the flip-flops D0–Dn, respectively. If there are no delays between the Q-outputs and the D-inputs of consecutive flip-flops in the chain 20, then per every clock pulse or triggering edge, data at the D-inputs of the flip-flops propagates to the D-inputs of the next flip-flops in the chain 20. It is desired that the clock pulse or triggering edge of the clock occur at the same time (or are in-phase) at the inputs of all the flip-flops, in order for the data as a whole to propagate together down the chain 20.

The problem with the data propagating chain 20 is that with the clock distribution network 24 shown in FIG. 1, the triggering edge or pulse of the clock does not reach all the clock inputs of the flip-flops at the same time. This results in the data not properly propagating as a whole through the chain; a condition generally termed in the art as "clock skew." To illustrate the problem of clock skew, assume that the time delay for data to propagate from the Q-output of a flip-flop to the D-input of the next flip-flop in the chain is given by $\Delta T_D$. Also, for this example, because the clock distribution network 24 shown in FIG. 1 requires the clock to propagate a longer length to reach the clock inputs of the flip-flops down the chain 20, assume that the time difference of clock at the clock inputs of consecutive flip-flops is given by $\Delta T_C$.

Given the above assumptions for the example, if the time delay $\Delta T_D$ for the data to propagate from the Q-output of flip-flop D0 to the D-input of flip-flop D1 is more than the time difference $\Delta T_C$ of the clock at the clock inputs of such flip-flops, then triggering edge of the clock it the clock input of flip-flop D1 will clock the current data at its D-input to its Q-output before the next data (the data that propagated through flip-flop D0) propagates to the D-input of flip-flop D1. This is the desired result, that the next data does not propagate to the D-input of the next flip-flop before that flip-flop is clocked for the current data.

However, with the clock distribution network 24 shown in FIG. 1, problems occur for flip-flops down the chain 20. For instance, the time delay of the clock to reach the clock input of flip-flop D2 is given by $2\Delta T_D$. Assume now that the time delay $\Delta T_D$ is smaller than the time delay $2\Delta T_C$, then the data that propagated through flip-flop D1 will reach the data input of flip-flop D2 before it is clocked. Thus, instead of the current data propagating through flip-flop D2 for that triggering time, the next data propagates through flip-flop D2, thereby, losing the current data for flip-flop D2. This results in the data as a whole improperly propagating down the chain 20. Thus, it is desirable that the clock distribution network be designed so that the flip-flops, or more generally, the clock recipient elements be clocked at substantially the same time to reduce or eliminate the effects of clock skew.

Referring now to FIG. 2, a block diagram of a prior art clock distribution network 30 formed on an ASIC substrate 37 is shown that reduces or eliminates the problem of clock skew. The prior art clock distribution network 30 reduces the clock skew problem by attempting to cause the phase of the clock signal at the clock inputs of all the clock recipient elements in the ASIC to be substantially the same. The clock distribution network 30 is generally referred in the relevant art as a "balanced clock tree," and therefore, will be referred to as such hereinafter.

The balanced clock tree 30 shown in FIG. 2 includes a main buffer 32 for receiving a clock signal from a clock source 34, and used as an initial driving stage for supplying the clock signal to the clock recipients of the ASIC. The output of the main buffer 32 is coupled to an H-shaped conductive tree structure 36 that is used as an initial conduit for the clock to propagate through to reach the clock recipients. The H-shaped conductive tree structure 36 includes an initial entry wide conductive line 38 (or entry conductive line, for short) having a first end coupled to the output of the main buffer 32 and a second opposite end connected to the middle of the mid-section conductive branch 40 of H-tree conductive structure. The ends of the mid-section conductive branch 40 connect to the middle of the outer conductive branches 42 and 44 of the H-tree conductive structure 36. Each of the ends of the outer conductive branches 42 and 44 is coupled to a buffer tree-network 46, which is, in turn, coupled to the clock recipients 48.

The H-tree conductive structure 36 including the entry conductive line 38 are designed so that the phase of the clock signal as it is split by the H-tree structure are substantially the same at the ends of the outer conductive branches 42 and 44, or alternatively, at the points in which the buffer tree-networks 48 connect to the H-tree structure. This is accomplished by forming the H-tree structure 36 on a substrate 37 that has substantially uniform dielectric constant, and by having the same conductive line lengths from the output of the main buffer 32 to the ends of the outer conductive branches 42 and 44, or alternatively, at the points that the buffer tree-networks 48 connect to the H-tree structure.

For instance, in the example balanced clock tree 30 shown in FIG. 2, the clock signal generated at the output of the main buffer 32 initially undergoes a phase shift of $\Delta\phi_1$ as it propagates through the entry conductive line 38. When the clock signal encounters the mid-section conductive line 40 of the H-tree structure 36, it splits the clock signal into two clock signals, each propagating towards respective outer conductive lines 42 and 44. The two clock signals each undergo a phase shift $\Delta\phi_2$ after propagating through the mid-section conductive line 40 of the H-tree structure 36 since the length of the mid-section line is the same on both sides of the entry conductive line 38.

When the two clock signals reach the outer conductive lines 42 and 44, they both split into four clock signals, each propagating towards respective ends of the outer conductive lines, or alternatively, towards the points in which the buffer tree-networks 46 connect to the H-tree structure 36. When the clock signals reach these points from the middle of respective outer conductive lines 42 and 44, they would have undergone a phase shift $\Delta\phi_3$. Thus, the phases of the clock signals at the respective buffer tree-network are substantially the same since they would have all undergone a total phase shift of:

$$\Delta\phi_{total}=\Delta\phi_1+\Delta\phi_2+\Delta\phi_3$$

Referring now to FIG. 3, a schematic and block diagram of a prior art buffer tree-network 46 of FIG. 2 is shown. The buffer tree-network 46 provides for further levels of driving stages for driving the clock signal to each of the clock recipients 48 of the ASIC. Like the H-tree conductive structure 36, the buffer tree-network 46 is also designed to distribute the clock signal so that the phases of the clock signal at the clock inputs of all the clock recipients are substantially the same.

In more detail, the buffer tree-network 46 may comprise of one or more levels of parallel buffers. In the example shown in FIG. 3, there are N-levels of parallel buffers. The level 1 buffers 52 are the first level of buffers which initially drives the clock signal that is received at the ends of the outer conductive lines 42 and 44 of the H-tree conductive structure 36. If there are two levels of buffers in the ASIC, then the output of the level 1 buffers are coupled to the inputs of the level 2 buffers 56. If there are more than two levels of buffers in the ASIC, then the outputs of the buffers at one level are coupled to the inputs of the buffers at the consecutive level. In other words, the output of a buffer at one level is coupled to the inputs of several buffers in the next level, and so on to meet the ASIC clock signal load.

The buffer tree-network 46 further includes a clock routing network for each level of parallel buffers. For instance, a level 1 clock routing network 50 is included that routes the clock signal from the ends of the outer conductive lines 42 and 44 of the H-tree conductive structure 36 to the inputs of the level 1 buffers 52. If there are two levels of buffers, then a level 2 clock routing network 54 is included for routing the clock signal from the outputs of the level 1 buffers 52 to the inputs of the level 2 buffers 56. If there are more then two levels of buffers, then there is a clock routing network for each level of buffers for routing the clock signal from the output of buffers at one level to the inputs of buffers at the consecutive level.

Each of the clock routing networks routes the clock signal to the inputs of the next level buffers in a manner that the phases of the clock signals at such inputs are substantially the same. For instance, level 1 clock routing network 50 routes the clock signal from the ends of the outer conductive lines 42 and 44 to the inputs of the level 1 buffers 52 in a manner that the phases of the clock signals at the inputs of the buffers are substantially the same. The level 2 clock routing network likewise routes the clock signals from the outputs of the level 1 buffers 52 to the inputs of the level 2 buffers 56 in a manner that the phases of the clock signals are substantially the same at the inputs of the level 2 buffers; and so on, in the same manner for all other clock routing networks pertaining to the other levels of buffers 3-N.

The level 1 clock routing network 50, which is shown in more detail in FIG. 3 than the other clock routing networks, is used herein as an example of one manner of routing the clock signals so that their phases at the inputs of the buffers at one level are substantially the same. The other levels of clock routing network can be routed in such a similar manner. In one manner, the level 1 clock routing network 50 attempts to equalize the clock signal phase at the buffer input by having the conductive line lengths from the ends of the outer conductive lines 42 and 44 of the H-tree conductive network 36 to the inputs of the level 1 buffers to be substantially the same. For instance, the conductive line length from node 0 (the point in which the level 1 clock routing network 50 connects to the H-tree conductive structure 36) to the inputs of buffers 52a and 52f which are taken off of nodes 3 and 3' are substantially the same, and results in a phase shift of the clock signal given by:

$$\Delta\phi_{52a}=\Delta\phi_{52f}=\Delta\phi_4+\Delta\phi_5+\Delta\phi_6+\Delta\phi_9$$

Similarly, the conductive line lengths from node 0 to the inputs of buffers 52b and 52e are substantially the same, and produces a phase shift of the clock signal given by:

$$\Delta\phi_{52b}=\Delta\phi_{52e}=\Delta\phi_4+\Delta\phi_5+\Delta\phi_8$$

In order for the phase of the clock signal to be the same at the inputs of buffers 52a, 52b, 52e and 52f, the following relationship holds:

$$\Delta\phi_8=\Delta\phi_6+\Delta\phi_9$$

Thus, if the ASIC layout permits, the clock routing networks can be designed to provide substantially the same conductive line lengths from the point at which the H-tree conductive structure 36 connects to the level 1 clock routing network to each input of the level 1 buffers 52. The same technique can be used for the other clock routing networks, such as level 2 clock routing network 54, so that the conductive line lengths from the output of one of the i'th level buffer to the inputs of the level (i+1) buffers are all substantially the same.

Sometimes, however, it may be difficult because of layout reasons to provide a conductive line of a sufficient length to equalize the clock signal phases at the inputs of the buffers. To illustrate this, assume for example that the phase shift from node 0 to the input of the buffer 52d is of sufficient length to provide the proper phase of the clock signal at the buffer's input. That is, the phase shift of the clock signal from node 0 to the input of buffer 52d is given by:

$$\Delta\phi_{52d}=\Delta\phi_4+\Delta\phi_7$$

In order for the clock signal phase at the input of buffer 52d to be equalized with the clock signal at the inputs of buffers 52a, 52b, 52e and 52f, the following relationship holds:

$$\Delta\phi_7=\Delta\phi_5+\Delta\phi_8=\Delta\phi_5+\Delta\phi_6+\Delta\phi_9$$

Also assume that the conductive line length between node 0 and the input of the buffer 52c is of insufficient length to cause the clock signal to undergo the proper phase shift. Specifically, because of layout reasons, assume that the conductive line between node 1 and the input of the buffer 52c cannot be made any longer in order to produce the desired phase shift of the clock signal. In other words, the following relationship holds:

$$\Delta\phi_{10}<\Delta\phi_7$$

To solve this problem of an insufficient conductive line length, a current load 58 is connected to the output of buffer 52c. The effects of the current load 58 on the clock signal causes it to undergo an additional phase shift $\Delta\phi_{11}$ because it effects the buffer driving response. In order to equalize the clock phase at the output of the buffer 52c with that of the outputs of the other buffers of the same level, the current load is made of sufficient size that the additional phase shift $\Delta\phi_{11}$ results in the clock phase at the output of buffer 52c to be equalized with the others. In other words, the following relationship holds:

$$\Delta\phi_{10}+\Delta\phi_{11}=\Delta\phi_7=\Delta\phi_5+\Delta\phi_8=\Delta\phi_5+\Delta\Omega_6+\Delta\phi_9$$

Therefore, by varying the length of the conductive lines to each of the input of the buffers and also employing current loads when the conductive lines cannot be made any longer because, for example, of layout reasons, the clock routing networks can be designed to provide substantially the same phase of the clock signal at the output of the buffers of the same level. This can be done for all levels of buffers so that the phases of the clock signal at the output of the N'th level buffers are substantially the same. This is assuming, of course, that each of the buffer in the buffer tree-network 46 causes the clock signal to undergo substantially the same phase shift.

Referring now to FIG. 4, a schematic diagram of a group of clock recipients 48, or more specifically, a chain of D flip-flops (D1–D6) is shown, wherein the flip-flops are driven by one of the N'th level buffers of the buffer tree-network 46 by way of a recipient clock routing network 60. The clock routing network 60 is similar to the clock routing networks of the buffer tree-network 46 in that it routes the clock signal from the output of one of the N'th buffers to the clock inputs of the clock recipients (D flip-flops D1–D6) so that the phases of the clock signal at each of the clock inputs of the clock recipients are substantially the same. In the example shown in FIG. 4, this can be done by designing the clock routing network so that the following phase-shift relationship holds:

$$\Delta\phi_7=\Delta\phi_5+\Delta\phi_8=\Delta\phi_5+\Delta\phi_6+\Delta\phi_9$$

In summary, the balanced clock tree 30 routes the clock signal in an ASIC in a manner that the phases of the clock signals at the clock inputs of the clock recipients are substantially the same. This is done by providing an H-tree conductive structure 36 for providing the initial distribution of the clock signal from the ASIC clock input to the inputs of the buffer tree-networks 46 in a manner that the phases of the clock signal thereat are substantially the same. The buffer tree-network 46 includes clock routing networks (e.g., 50 and 54) for providing the clock signal to the buffers in a manner that the phases of the clock signal at the output of each of the buffer within one level are substantially the same. Another similar clock routing network is provided at the output of the last level of buffers so that the clock signal is provided to the clock input of the clock recipients in a manner that the phases of the clock signal thereat are substantially the same. This type of clock distribution reduces the adverse effects of clock skew.

Although the balanced clock tree 30 is useful for reducing clock skew problems, there may be disadvantage to it when the number of clock recipients in an ASIC becomes large. One disadvantage of the balanced clock tree is that when the number of clock recipient becomes large, problems such as ground bounce and $V_{DD}$ noise results. This is because a large number of clock recipients are being clocked at substantially the same time. The result is that it takes a relatively large current to clock all those clock recipients at substantially the same time. This large current causes the ASIC ground to jump in voltage during clocking; a condition known as ground bounce. The same large current during clocking also results in the $V_{DD}$ voltage supply to drop during clocking of the clock recipients, which causes noise on the $V_{DD}$ line.

Another disadvantage is that it becomes increasingly difficult to layout or balance the clock distribution network when the number of clock recipient becomes large. Many ASIC design ECAD systems perform the layout and the balancing of the clock distribution network during the physical design stage of design, which may prove to be too late for effective balancing of the clock distribution network when the number of clock recipient becomes very large.

Furthermore, another disadvantage of the prior art clock distribution network and the design method is the possibility of unused cycle time. For example, FIG. 5 shows registers 71, 73 and 75 with logic blocks 72 and 74 which form the data propagation paths between the registers. Logic block 72 is placed in between registers 71 and 73, and the logic block 74 is placed in between registers 73 and 75. For illustration purposes, the following facts are assumed. The data propagation path between the registers 71 and 73 requires 5 ns of clock cycle time to transmit the data from register 71 to register 73, and the data propagation path between registers 73 and 75, which is the longest data path in the ASIC, requires 7 ns of clock cycle time to transmit the data from register 73 to register 75. Since the data propagation path between registers 73 and 75 requires 7 ns of clock cycle time, the chip level clock cycle time has to be at least 7 ns in order to match the delay in the data propagation path between registers 73 and 75, which is the longest data propagation path in the ASIC. If the chip level clock cycle time is shorter than 7 ns, then the data from register 73 would not have enough time to reach register 75 for the proper propagation of the data because the data propagation path between registers 73 and 75 takes at least 7 ns to travel. Because the prior art clock distribution network 30 reduces the clock skew problem by attempting to clock the clock recipients at the same time by causing the phase of the clock signal at the clock inputs of all the clock recipient elements in the ASIC to be substantially the same, the chip level clock cycle time has to be at least as long as the delay in the longest data propagation path in the ASIC for proper data propagation. In the example shown above, 2 ns of clock cycle time is wasted for registers 71 and 73 because the data propagation path between registers 73 and 75 takes 7 ns while the data propagation path between registers 71 and 73 takes only 5 ns of clock cycle time. Registers 71 and 73 have to wait idly for additional 2 ns until register 75 receives its data from register 73.

Therefore, there is a need for methods and computer-aided design tools for planning the clock distribution network in the conceptual design phase of the ASIC devices to reduce clock skew, ground bounce, VDD noise and idle clock cycle time, and avoid the difficulty of balancing the clock distribution network in the latter stages of the ASIC design.

SUMMARY OF THE INVENTION

It is an object of the present invention to provide methods for planning the clock distribution network in the conceptual design phase of the ASIC devices and computer-aided design tools implementing the methods, which obviate for practical purposes the above mentioned limitations.

According to an embodiment of the invention, a clock distribution network for an integrated circuit is designed by partitioning the technology-independent description of the integrated circuit into partitioned groups based on the clocking time of the clock recipients in each of the partitioned groups. In addition, a clock budgeting plan is generated by creating target timing groups based on the number of distinct switching or clocking times of the clock recipients in the partitioned groups and assigning each of the partitioned groups to one of the target timing groups based on the clocking time of the clock recipients in each of the partitioned groups. The clock recipients in each of the target timing groups clock together at a substantially same time and clock recipients in different target groups clock at different times. The clock distribution network is then created based on the clock budgeting plan such that the clock distribution network provides a clock signal to clock recipients in each of the target timing groups in a manner that the clock recipients in each of the target timing groups are clocked together at a substantially same time.

In particular embodiments of the present invention, maximum allowable data propagation times between the clock recipients are calculated based on the assigned target timing group of each of the clock recipients, and the logic blocks forming the data propagation paths are modified based on the calculated maximum allowable propagation times. Generally, the logic blocks are modified by adding an extra logic level or by reducing the number of gates in the logic blocks. In addition, the clocking or switching time of the clock recipients is changed by switching the clock recipients from one target timing group to another target timing group or by creating a new target timing group for the clock recipients changing the switching time, and such changing of the clocking time may modify the data propagation time between the clock recipients, the clock budgeting plan, and, consequently, the technology-independent description. A gate-level description of the circuit is generated from the modified technology-independent description, and the gate level descriptions of each of the clock recipients are mapped into an appropriate target timing group in the clocking budgeting plan. The clock distribution network is then created based on the possibly modified clock budgeting plan such that the clock distribution network provides a clock signal to clock recipients in each of the target timing groups in a manner that the clock recipients in each of the target timing groups are clocked together at a substantially same time.

Other features and advantages of the invention will become apparent from the following detailed description, taken in conjunction with the accompanying drawings which illustrate, by way of example, various features of embodiments of the invention.

BRIEF DESCRIPTION OF THE DRAWINGS

The above-mentioned objects and other objects and features of the invention and the manner of attaining them will become apparent, and the invention itself will be best understood by reference to the following description of the preferred embodiments of the invention taken in conjunction with the accompanying drawings, wherein:

FIG. 1 is a schematic and block diagram of a prior art chain of D fliplops having data clocked therethrough by a common clock source, shown for the purpose of describing the effects of clock skew.

FIG. 2 is a schematic and block diagram of a prior art balanced clock tree used for reducing the effects of clock skew.

FIG. 3 is a schematic and block diagram of a prior art buffer network or tree as an element of the prior art balanced clock tree of FIG. 2, wherein the buffer network or tree distributes the clock signal to clock recipient elements in a manner that it reduces clock skew.

FIG. 4 is a prior art chain of D flip-flops being driven by one of the buffers of the buffer network or tree of FIG. 3, wherein the clock signal distribution from the buffer output to the inputs of the flip-flops are configured to reduce clock skew.

FIG. 5 is a diagram showing registers and logic blocks forming the data propagation paths between the registers.

FIG. 6 is a flow diagram for illustrating integrated circuit design according to a preferred embodiment of the invention.

FIG. 7 is a breakdown of a clock budgeting plan according to a preferred embodiment of the invention.

FIG. 8 is a diagram showing clock recipients and a logic block forming a data propagation path between the clock recipients.

FIG. 9 is a clock distribution network created based on a clock budgeting plan according to a preferred embodiment of the invention.

FIG. 10 is a block diagram of a general-purpose computer system, representing one suitable computer platform for implementing the methods of the invention.

DESCRIPTION OF THE PREFERRED EMBODIMENT(S)

FIG. 6 illustrates a flow diagram for providing an overview of ASIC chip design according to preferred embodiments of the present invention. It should be understood that the description contained herein are in terms of a suite of software "blocks" that can be run on any suitable computer system.

In step 100, an IC system design specification is prepared. The preparation in step 100 consists of system or device specification and may include functional specifications of subsystem elements, timing specifications and I/O requirements, and power, package and interface requirements. At this initial step of the design cycle, the desired system design is described in the highest level of abstraction.

In step 110, a technology-independent description is produced by formulating a behavioral description of the circuit's desired behavior in a high-level hardware description language (HDL), such as VHDL or Verilog-HDL. Instead of being formulated in a behavioral description, the technology-independent description can also be formulated in a register-transfer level (RTL) description of the circuit in terms of predesigned functional blocks, such as memories and registers. The technology-independent description consists of functional description of the design and all of its subsystem elements that satisfy the IC design specification prepared in step 100.

In step 120, the technology-independent description formulated in step 110 is functionally partitioned into separate modules that will make the overall synthesis, analysis and verification tasks more manageable. The partitioning process consults technology files containing packaging, I/O capabilities and other technology-dependent information to optimally partition the design.

After the technology-independent description has been functionally partitioned into separate modules in step 120, step 125 creates a clock budgeting plan by partitioning the technology-independent description into separate, distinct groups based on the switching or clocking time of the clock recipients (e.g., flip-flops, registers, latches, etc.) in each of the partitioned groups, creating distinct target timing groups based on the number of distinct switching or clocking times of the clock recipients in the partitioned groups, and assigning each of the partitioned groups to one of the target timing groups based on the switching or clocking time of the clock recipients in each of the partitioned groups. In other words, the technology-independent description is partitioned by clustering or grouping clock recipients which switch or clock at the same time such that the clock recipients in each of the target timing groups switch or clock at the same time while the clock recipients in different target timing groups switch at different times. For example, if one group of clock recipients is clocking at time t1 and another group of clock recipients is clocking at time t2, the group of clock recipients clocking at t1 is assigned to target timing group t1, while the group of clock recipients clocking at t2 is assigned to target timing group t2 different from target timing group t1. Thus, the clock budgeting plan is generated by assigning a certain target timing group to a group of clock recipients which clock at the same time and assigning another target timing group to another group of clock recipients which clock at the same time but at a different time from the clock recipients in other target timing groups. Therefore, clock recipients in one target timing group switch or clock at a different time from clock recipients in another target time group.

Generally, the number of target timing groups is initially equal to the number of distinct switching or clocking times of the clock recipients in the partitioned groups. However, that number may change later depending on the possible design changes. The clock budgeting plan lists each of the partitioned technologyindependent descriptions under an appropriate target timing group. Since the clock budgeting plan is generated based on the switching time of the clock recipients, the partitioned target time groups may or may not correspond to the functionally partitioned modules created in step 120.

Furthermore, the clock recipients in each of the target time groups can be further divided into sub-groups based on the functionality, locality or other constraints imposed by the designer. For example, one group of clock recipients used in multiplication may switch at the same time as another group of clock recipients used in signal processing. Since the both groups switch at the sametime, the clock recipients in the both groups will be placed under the same target timing group. However, because each group of clock recipients is used for different functions, it may be more convenient to divide each group into separate sub-groups within the same target timing group.

FIG. 7 shows a break down of a clock budgeting plan 200 with target timing groups 210, 220, 230 and 240 in accordance with a preferred embodiment of the present invention. Target timing group 210 is further divided into sub-groups 211, 212 and 213 based upon any one of the various constraints mentioned previously (e.g., functionality). FIG. 7 also shows relative time line 205 with target timing groups 210, 220, 230 and 240 placed under relative time markers of 0, 1.5 ns, 2 ns and −2 ns, respectively. Clock budgeting plan 200 shows that the clock recipients in target time group 210 switch or clock at a relative time of 0 while the clock recipients in groups 220, 230 and 240 switch at a relative time of +1.5 ns, +2.0 ns and −2.0 ns, respectively. In other words, the clock recipients in group 220 switch or clock 1.5 ns after the clock recipients in group 210, and the clock recipients in group 230 switch 2 ns after the clock recipients in group 210, whereas, the clock recipients in group 240 switch 2 ns before the clock recipients in group 210, which means that the clock recipients in group 230 switch 4 ns after the clock recipient in group 240 and so on. The clock recipients in sub-groups 211, 212 and 213, which are part of the target timing group 210, all switch at the same time (i.e., at the relative time of 0). It should be noted that the clock budgeting plans in preferred embodiments of the present invention are not limited to the numbers and target timing groups illustrated in FIG. 7, but can include many other different combinations of target timing groups depending on the design specification of the ASIC chip.

In addition to relative timing, clock budgeting plan 200 discloses information regarding maximum allowable data propagation times between different groups of clock recipients. Assuming for illustration purposes that the chip level clock cycle time is 10 ns, clock budgeting plan 200 discloses the following about the maximum allowable data propagation time. As discussed above, group 220 switches 1.5 ns after group 210 or its sub-groups 211, 212 and 213. This means that on a given incoming clock cycle time of 10 ns, the maximum allowable data propagation time from the clock recipients in group 210 to clock recipients in group 220 is 11.5 ns because the clock recipients in group 220 switch 1.5 ns after the clock recipients in group 210 (10 ns of clock cycle time when clock recipients in both groups are able to receive data +1.5 ns delay time=11.5 ns). In other words, the logic block forming the data propagation path between the clock recipients in group 210 and group 220 has to allow the data from group 210 to propagate through the block to group 220 within 11.5 ns. Similarly, the maximum allowable data propagation time from clock recipients in group 220 to clock recipients in group 230 is 10.5 ns since clock recipients in group 230 switch 0.5 ns after the clock recipients in group 220. The same fact holds true for other data propagation times. On the other hand, the maximum allowable data propagation time from clock recipients in group 220 to clock recipients in group 210 (i.e., the data is going from group 220 to group 210) is 8.5 ns because the clock recipients in group 210 switch 1.5 ns earlier than the clock recipients in group 220. Similarly, the maximum allowable data propagation time from group 210 to group 240 is only 8 ns since group 240 switches 2 ns before group 210. The above example illustrates the following important fact: the chip level clock cycle time can be made shorter than the longest data propagation time by utilizing a clock budgeting plan. In the prior art circuits and methods, the chip level clock cycle time had to be at least as long as the longest data propagation time because all of the clock recipients had to switch at a same time. However, in preferred embodiments of the present invention, the chip level clock cycle time can be made shorter than the longest data propagation time by creating a clock budgeting plan which partitions the technology-independent description into separate target timing groups and allowing clock recipients in different target timing groups to switch at different times. As a result, the clock budgeting plan allows the designer of the ASIC to have the option to plan and create data propagation paths that take longer than the chip level clock cycle time. Consequently, the overall speed of the ASIC chip can be increased because the chip level clock cycle time can be made shorter than the longest data propagation path.

The clock budgeting plan offers other advantages in addition to shorter chip level clock cycle time. FIG. 8 shows clock recipients 310 which is a part of target timing group 210, clock recipients 320 which is a part of target timing group 220 and a logic block 300 which forms the data propagation path that receives data from clock recipients 310 and transmits the data to clock recipients 320. Logic block 300 can be a multiplier, an adder, a signal processor or any other types of logic gate blocks. As stated above, because clock recipients 320 switch or clock 1.5 ns after clock recipients 310, the maximum data propagation time from clock recipients 310 to clock recipients 320 is 11.5 ns, instead of being equal to the chip level clock cycle time of 10 ns. Therefore, extra 1.5 ns has been gained in the data propagation time. Consequently, the extra 1.5 ns gives the designer the flexibility or the option of adding more logic levels to logic block 300 or adding more functionality to logic block 300 because the designer has extra 1.5 ns of data propagation time. For example, if logic block 300 is a multiplier, the designer can add an adding function to logic block 300. In addition to adding more functionality, the designer can realize same functionality with fewer number of gates. For example, if logic block 300 is a very fast multiplier with 10,000 gates, the designer can instead employ a slower multiplier with fewer number of gates such as a multiplier with 5000 gates because the data has extra 1.5 ns to propagate through logic block 300. The same fact holds true for logic blocks between other clock recipients such as the logic block that forms the data propagation path from the clock recipients in target timing group 240 to the clock recipients in target timing group 210.

In addition to the above mentioned advantages, the clock budgeting plan offers the designer extra flexibility of easily modifying the design of the ASIC. The clock budgeting plan can be modified by shifting clock recipients in one target timing group to another target timing group to gain extra data propagation time. For 130 example, the clock recipients in sub-groups 211 and 212 shown in FIG. 7 switch at the same time, which means that the data propagation time from sub-group 211 to sub-group 212 has to be less than or equal to the chip level clock cycle time of 10 ns. However, if it is determined that the data propagation path from sub-group 211 to sub-group 212 needs to be longer than the clock cycle time in order to accommodate more logic levels or to decrease the number of gates used, for example, sub-group 212 can be moved from target timing group 210 to another target timing group that switches after target timing group 210 such as target timing groups 220 and 230. Instead of switching to another target timing group, a new target timing group, which clocks after target timing group 210, can be formed for the clock recipients in sub-group 212. On the other hand, if the designer wants to increase the processing speed of a particular operation and the data path between the clock recipients used in the operation takes less time than the chip level clock cycle time, the designer can move the clock recipients in one target timing group to another target timing group that switches before the present target timing group. The designer is able to manipulate the clock budgeting plan in order to increase or decrease the data propagation time between the groups of clock recipients so that the desired behavior of the ASIC is achieved. However, it may be necessary to modify the technology-independent description if any change is made to the clock budgeting plan or to the logic blocks forming the data propagation paths between the clock recipients. It is again noted that the preferred embodiments of the present invention are not just limited to the numbers and examples given above which are used for illustrative purposes.

Referring back to FIG. 6, the resulting technology-independent description, which may have been modified by manipulating the clock budgeting plan, is simulated in step 126 to ensure that it conforms to the desired behavioral description.

In step 130, a gate-level, technology dependent description is synthesized based on the technology-independent description from step 126 by preferably running an automated synthesis tool on the technology-independent description. During step 130, physically realizable gates and clock recipients such as flip-flops, latches and registers are selected from a pre-defined library 136 and are interconnected in a manner so as to satisfy the relationships and to perform the processing defined by the technology-independent description. Preferably, step 130 utilizes pre-defined user design constraints 137 which have been formulated in an effort to enhance the feasibility of the design, particularly with respect to problems which might otherwise not be discovered until later in the design cycle. The gate level description is usually given in the form of a net list from which a device can be automatically physically created.

In step 135, after each of the clock recipients is specifically identified in step 130 during the gate-level description synthesis, each of the clock recipients is exactly mapped into an appropriate target timing group in the clock budgeting plan. For example, in FIG. 7, clock recipients which switch at a relative time of 0 are included in target timing group 210, so any clock recipients identified in the gate-level description as switching at a relative time of 0 are listed under target timing group 210. If flip-flops identified as f0, f1 and f2 switch at a relative time of 0, the flip-flops are listed under or mapped into target timing group 210. Every identified clock recipients in the gate-level description is mapped into an appropriate target timing group in the clock budgeting plan. Therefore, the clock budgeting plan will list every identified clock recipients under an appropriate target timing group based on the switching or clocking time of the clock recipients.

In gate-level verification step 140, a computer simulation is run to test the circuit design synthesized during gate-level synthesis step 130. The goals of this simulation are to determine whether all performance criteria have been met and whether any timing or other circuit errors will occur in response to a variety of different input signals and conditions. Upon completion of gate-level verification step 140, the netlist from the gate-level description is provided to physical design step 150.

It should be noted that while the foregoing design cycle is preferred, variations of the foregoing may also be used, as will be apparent to those skilled in the art. In addition, although the foregoing design process is described and shown in FIG. 6 as being purely sequential, many times one or more of the steps will need to be repeated. That is, if the design is found to be unfeasible at one step, an earlier step might need to be re-executed to correct the problem. For example, it might occur that in step 130 a gate-level description can not be generated to satisfy the technology-independent description requirements using the available technology library, while at the same time maintaining the user's design constraints. In this case, the technology-independent description and the clock budgeting plan may need to be redesigned in order to achieve a feasible design. Finally, within a given step testing will very often be performed in order to verify that the design is feasible and meets all required criteria.

In physical design step 150, the netlist generated in step 130 and verified in step 140 is mapped to information for physically implementing the corresponding circuit on an IC die. The objective of physical design is to determine an optimal arrangement of devices in a plane or in a three-dimensional space, and an efficient interconnection or routing scheme between the devices to obtain the desired functionality. One goal of physical design step 150 is to implement the design using minimum chip area. Other factors considered during physical design include thermal generation, power/ground noise, electromagnetic effects and the number of metal layers available for wire routing. Upon completion of physical design, the design is again tested for feasibility.

Step 150 produces a set of design files in an unambiguous representation known as an intermediate form that describes the layout. The design files are then converted into pattern generator files that are used to produce patterns called masks by an optical or electron beam pattern generator.

During step 150, a clock distribution network for the circuit is also created based on the clock budgeting plan. The clock distribution network uses segmented clock signal distribution method for clocking different clock recipients at different times as described in co-pending U.S. patent application Ser. No. 08/934,418, titled "Segmented Clock Distribution Network and Method Therefor", which application is incorporated herein by reference as though set forth herein in full.

The clock budgeting plan includes a listing of all of the clock recipients such that each of the clock recipients is listed under an appropriate target timing group based on the clocking time of the clock recipients, as discussed above. The clock distribution network is created based on the clock budgeting plan such that the clock distribution network provides a clock signal to clock recipients in each target timing group in a manner that the clock recipients in each target timing group are clocked together at a same time. For example, the clock distribution network provides a clock signal to a first group of clock recipients in a manner that the first group of clock recipients is clocked together at a time $T_0$, for example, while the clock signal is provided to a second group of clock recipients in a manner that the second group of clock recipients is clocked together at a time $T_1$ that is different than the time $T_0$ when the first group of clock recipients is clocked. The clock distribution network can be easily implemented because the clock budgeting plan has already separated the clock recipients in the ASIC into distinct target timing groups.

The advantage of the above segmented clock signal distribution method using the clock budgeting plan over the prior art is that when the ASIC includes a relatively large number of clock recipients, substantial reduction in ground bounce and VDD noise are achieved if the clock recipients of the ASIC are not all clocked at the same time. With the prior art method, as explained earlier, a balanced clock tree is incorporated in an ASIC so that all the clock recipients of the ASIC are clocked at substantially the same time. The main concern for the prior art method of clocking all clock recipients of an ASIC at substantially the same time is reduction of clock skew. However, as the number of clock recipients in an ASIC grows to a relatively large number, the current required to clock all the clock recipients of an ASIC becomes relatively large. The large source current for the ASIC causes a voltage rise of the ASIC ground during clocking, which results in the adverse effect of ground bounce. Also, this large surge of source current during clocking also adversely affects the $V_{DD}$ supply source to the ASIC, thereby causing VDD noise. In addition, as the number of clock recipients grow in an ASIC, the design and layout of the balanced clock tree becomes increasingly difficult.

So, by dividing the clock recipients of the ASIC into a plurality of target timing groups which are each clocked at a distinct time, the amount of current required during any clocking of a group is substantially less. The less current required for clocking results in a substantial reduction in ground bounce and $V_{DD}$ noise. In addition, if a balanced clock tree is used for routing the clock signal to one of the groups of clock recipients of the ASIC, then the design and layout of the balanced clock tree is not as difficult because that particular group of clock recipients consists of only a portion of the total clock recipients in the ASIC. In other words, less clock recipients, easier to design and layout a balanced clock tree. Including smaller balanced clock tree for each group of clock recipients, from a design standpoint, is much easier than including a large balanced clock tree for total clock recipients of an ASIC.

The preferred manner of achieving the difference in the timing of the clocking for the first and second groups of clock recipients is by providing the clock signal to the clock input of the clock recipients in the first group in a manner that it cycles at a relative phase different than that of the clock signal at the clock input of the second group of clock recipients. The preferred manner of having the clock signal cycles at a different relative phase at the clock input of each of the groups of clock recipients is by either delaying or phase-shifting the clock signal prior to it being applied to one of the groups of clock recipients. The delaying and phase-shifting, for example, can be performed by a conventional buffer or a driver. Also a small balanced clock tree can be used for each group of clock recipients so that the clock recipients for each group are clocked at substantially the same time. This reduces clock skew problems within each group. It shall be understood that the method can be applied to more than two groups of clock recipients, whereby each group are clocked at different times.

Referring now to FIG. 9, a clock diagram of a clock distribution network 400 implemented by using a clock budgeting plan in accordance with a preferred embodiment is shown. The clock distribution network 400 is particularly useful for routing the clock signal of an ASIC and is typically formed on the ASIC substrate 402. The clock distribution network 400 may include two or more groups of clock distribution network and recipients, such as clock distribution groups 404, 406 and 408 shown in FIG. 9 for illustration purposes. Each of the clock distribution groups, which are derived from the target timing groups in the clock budgeting plan, includes a group of clock recipients and a smaller clock distribution network for routing the clock signal thereto in a manner that the clock recipients within a group are clocked at substantially the same time in order to reduce clock skew. Each of the clock distribution group includes a common clock input for receiving the clock signal applied to the ASIC.

The clock distribution network 400 further includes a main buffer or driver 410 for initially receiving the clock signal and providing an initial driving stage for the clock signal. The output of the buffer or driver 410 is coupled to the clock input of the clock distribution group I 404 and to the input of a second buffer or driver 412. The output of the second buffer or driver 412 is coupled to the clock input of the clock distribution group II 406 and to the input of a third buffer or driver 414. The output of the third buffer or driver 414 is coupled to the clock input of the clock distribution group III 408 and to the input of yet another buffer if more clock distribution groups are needed.

In operation, each of the buffer or driver 412 and 414 causes the clock signal at their respective input to undergo a delay or phase shift as it is produced at their respective outputs. For this example, assume that the line length between the buffers and the clock input of the clock distribution network are negligible and do not affect the phase of the clock signal. Assuming that the relative phase of the clock signal at the output is given by a reference phase of $\phi_0$, then the relative phase of the clock signal at the output of buffers or drivers 412 and 414 are $\phi_1$ and $\phi_2$, respectively, due to the phase shift of the clock signal caused by the buffers or drivers. As a result of these phase shifts, the clock signal at the clock inputs of clock distribution groups I, II and III (404, 406 and 408) have relative phases of $\phi_0$, $\phi_1$, and $\phi_2$. If the relative phases $\phi_0$, $\phi_1$, and $\phi_2$ are different, the clock recipients within each of the distribution groups will be clocked at different times. This results in the reduction of ground bounce and $V_{DD}$ noise. Although the preferred manner of achieving the delay or phase shift in the clock signal is by use of buffers or drivers, it shall be understood that other devices that causes delays or phase shift in the clock signal may also be used.

Generally, the methods described herein with respect to IC design will be practiced with a general purpose computer, either with a single processor or multiple processors. The methods described herein will also be generally implemented in an ECAD system running on a general purpose computer. FIG. 10 is block diagram of a general purpose computer system, representing one of many suitable computer platforms for implementing the methods described above. FIG. 10 shows a general purpose computer system 450 in accordance with the present invention. As shown in FIG. 10, computer system 450 includes a central processing unit (CPU) 452, read-only memory (ROM) 454, random access memory (RAM) 456, expansion RAM 458, input/output (I/O) circuitry 460, display assembly 462, input device 464, and expansion bus 466. Computer system 450 may also optionally include a mass storage unit 468 such as a disk drive unit or nonvolatile memory such as flash memory and a real-time clock 470.

CPU 452 is coupled to ROM 454 by a data bus 472, control bus 474, and address bus 476. ROM 454 contains the basic operating system for the computer system 450. CPU 452 is also connected to RAM 456 by busses 472, 474, and 476. Expansion RAM 458 is optionally coupled to RAM 456 for use by CPU 452. CPU 452 is also coupled to the I/O circuitry 460 by data bus 472, control bus 474, and address bus 476 to permit data transfers with peripheral devices.

I/O circuitry 460 typically includes a number of latches, registers and direct memory access (DMA) controllers. The purpose of I/O circuitry 460 is to provide an interface between CPU 452 and such peripheral devices as display assembly 462, input device 464, and mass storage 468.

Display assembly 462 of computer system 450 is an output device coupled to I/O circuitry 460 by a data bus 478. Display assembly 462 receives data from I/O circuitry 460 via bus 478 and displays that data on a suitable screen.

The screen for display assembly 462 can be a device that uses a cathode-ray tube (CRT), liquid crystal display (LCD), or the like, of the types commercially available from a variety of manufacturers. Input device 464 can be a keyboard, a mouse, a stylus working in cooperation with a position-sensing display, or the like. The aforementioned input devices are available from a variety of vendors and are well known in the art.

Some type of mass storage 468 is generally considered desirable. However, mass storage 468 can be eliminated by providing a sufficient mount of RAM 456 and expansion RAM 458 to store user application programs and data. In that case, RAMs 456 and 458 can optionally be provided with a backup battery to prevent the loss of data even when computer system 450 is turned off. However, it is generally desirable to have some type of long term mass storage 468 such as a commercially available hard disk drive, nonvolatile memory such as flash memory, battery backed RAM, PC-data cards, or the like.

A removable storage read/write device 469 may be coupled to I/O circuitry 460 to read from and to write to a removable storage media 471. Removable storage media 471 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 450 by typing on a keyboard, manipulating a mouse or trackball, or "writing" on a tablet or on position-sensing screen of display assembly 462. CPU 452 then processes the data under control of an operating system and an application program, such as a program to perform steps of the inventive method described above, stored in ROM 454 and/or RAM 456. CPU 452 then typically produces data which is output to the display assembly 462 to produce appropriate images on its screen.

Expansion bus 466 is coupled to data bus 472, control bus 474, and address bus 476. Expansion bus 466 provides extra ports to couple devices such as network interface circuits, modems, display switches, microphones, speakers, etc. to CPU 452. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media includes, byway of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Although the present invention has been described in detail with regarding the exemplary embodiments and drawings thereof, it should be apparent to those skilled in the art that various adaptations and modifications of the present invention may be accomplished without departing from the spirit and scope of the invention. Accordingly, the invention is not limited to the precise embodiment shown in the drawings and described in detail hereinabove.

What is claimed is:

1. A method of designing a clock distribution network for an integrated circuit comprising the following steps:
    partitioning a description of the integrated circuit into separate functional modules; and
    generating a clock budgeting plan.

2. The method of claim 1, wherein said description is a technology-independent description.

3. The method of claim 1 wherein the step of generating a clock budgeting plan comprises the following steps:
    partitioning the description of the integrated circuit into partitioned groups based on a clocking time of clock recipients in each of the partitioned groups;
    creating a target timing group for each distinct clocking time of each of the partitioned groups; and
    assigning each of the partitioned groups to one target timing group wherein each target timing group has a corresponding relative clock phase that differs from that of every other target timing group for at least one of avoiding ground bounce and Vdd noise, reducing clock cycle time, and increasing data propagation time beyond the chip level clock cycle time.

4. The method of claim 3, wherein the clock recipients in each of the target timing groups clock at a substantially same time and clock recipients in different target timing groups clock at different times.

5. The method of claim 3, wherein the target timing groups are created based on the number of distinct clocking times of the clock recipients in the partitioned groups.

6. The method of claim 3, further comprising the following step:
    changing the clocking time of the clock recipients by creating an additional target timing group and assigning the clock recipients to the additional target timing group.

7. The method of claim 3, further comprising the following step:
    dividing the clock recipients in each of the target timing groups into subgroups.

8. The method of claim 3, further comprising the following step:
    calculating a maximum allowable data propagation time between clock recipients in the integrated circuit based on the assigned target timing group of each of the clock recipients.

9. The method of claim 8, further comprising the following step:
    modifying designs of logic blocks between the clock recipients based on the maximum allowable data propagation time.

10. The method of claim 9, wherein the designs of the logic blocks are modified by adding an extra level of logic to the logic blocks.

11. The method of claim 9, wherein the designs of the logic blocks are modified by reducing the number of gates in the logic blocks.

12. The method of claim 3, further comprising the following step:
    changing the clocking time of the clock recipients by switching the clock recipients from one target timing group to another target timing group to achieve a desired behavior of the integrated circuit.

13. The method of claim 12, wherein the changing of the clocking time modifies data propagation times between the clock recipients, the clock budgeting plan and the technology-independent description.

14. The method of claim 13, further comprising the following steps:
    generating a gate level-description from the modified technology-independent description;
    mapping the gate-level description of each of the clock recipients into an appropriate one of the target timing groups in the clock budgeting plan; and
    creating the clock distribution network based on the modified clock budgeting plan.

15. The method of claim 3, further comprising the following step:
    generating a gate-level description of the circuit from the technology-independent description.

16. The method of claim 15, further comprising the following step:
    mapping the gate-level description of each of the clock recipients into an appropriate one of the target timing groups in the clock budgeting plan.

17. The method of claim 3, further comprising the following step:
    creating the clock distribution network based on the clock budgeting plan, wherein the clock distribution network provides a clock signal to clock recipients in each of the target timing groups in a manner that the clock recipients in each of the target timing groups are clocked together at a substantially same time.

18. The method of claim 1, wherein the clock recipients in each of the partitioned groups switch at a substantially same time.

19. The method of claim 1 wherein the step of generating a clock budgeting plan comprises creating data propagation paths between the clock recipients that propagate data in a time longer than a chip level clock cycle time of the integrated circuit.

20. A method according to claim 1, wherein said clocking time of clock recipients in each of the partitioned groups is defined relative to said clocking time of clock recipients in another of the partitioned groups.

21. A method for designing an electronic circuit having a clock distribution network on an integrated circuit die, said method comprising the following steps:
    generating a hardware description language (HDL) description of the circuit;
    partitioning the HDL description into partitioned groups based on a clocking time of clock recipients in each of the partitioned groups; and
    generating a clock budgeting plan.

22. The method of claim 21 wherein the step of generating a clock budgeting plan comprises the following steps:
    creating target timing groups; and
    assigning each of the partitioned groups to one of the target timing groups based on the clocking time of the clock recipients in each of the partitioned groups wherein each of the target timing groups has a corresponding relative clock phase that differs from that of every other of the target timing groups.

23. The method of claim 22, wherein the clock recipients in each of the target timing groups clock at a substantially same time and clock recipients in different target timing groups clock at different times.

24. The method of claim 22, wherein the target timing groups are created based on the number of distinct clocking times of the clock recipients in the partitioned groups.

25. The method of claim 22, further comprising the following step:
    changing the clocking time of the clock recipients by creating an additional target timing group and assigning the clock recipients to the additional target timing group.

26. The method of claim 22, further comprising the following step:
    calculating maximum allowable data propagation times between clock recipients in the electronic circuit based on the assigned target timing group of each of the clock recipients.

27. The method of claim 26, further comprising the following step:
    modifying designs of logic blocks between the clock recipients based on the maximum allowable data propagation times.

28. The method of claim 27, wherein the designs of the logic blocks are modified by adding an extra level of logic to the logic blocks.

29. The method of claim 27, wherein the designs of the logic blocks are modified by reducing the number of gates in the logic blocks.

30. The method of claim 22, further comprising the following step:
    creating data propagation paths between the clock recipients which propagates data in a time longer than a chip level clock cycle time of the circuit.

31. The method of claim 22, further comprising the following step:
    changing the clocking time of the clock recipients by switching the clock recipients from one target timing group to another target timing group.

32. The method of claim 22, wherein the changing of the clocking time modifies data propagation times between the clock recipients, the clock budgeting plan and the HDL description.

33. The method of claim 22, further comprising the following step:
    generating a gate-level description of the circuit from the HDL description.

34. The method of claim 33, further comprising the following step:
    mapping the gate-level description of each of the clock recipients into an appropriate one of the target timing groups in the clock budgeting plan.

35. The method of claim 32, further comprising the following steps:
    generating a gate level-description of the circuit from the modified HDL description;
    mapping a gate-level description of each of the clock recipients into an appropriate one of the target timing groups in the clock budgeting plan; and
    creating the clock distribution network based on the modified clock budgeting plan.

36. The method of claim 22, further comprising the following step:
    creating the clock distribution network based on the clock budgeting plan, wherein the clock distribution network provides a clock signal to clock recipients in each of the target timing groups in a manner that the clock recipients in each of the target timing groups are clocked together at a substantially same time.

37. A method according to claim 21, wherein said clocking time of clock recipients in each of the partitioned groups is defined relative to said clocking time of clock recipients in another of the partitioned groups.

38. A method for synthesizing an electronic circuit description of a system from a technology-independent description of the system comprising the following steps:
    partitioning the technology-independent description into partitioned groups based on a clocking time of clock recipients in each of the partitioned groups; and
    generating a clock budgeting plan by assigning each of the partitioned groups to one target timing group based on the clocking time of the clock recipients in each of the partitioned groups wherein each target timing group has a corresponding relative clock phase that differs from that of every other target timing group.

39. The method of claim 38, wherein the technology-independent description is written in a hardware description language.

40. The method of claim 38, further comprising the following step:
    creating a clock distribution network based on the clock budgeting plan, wherein the clock distribution network provides a clock signal to clock recipients in each of the target timing groups in a manner that the clock recipients in each of the target timing groups are clocked together at a substantially same time.

41. A method according to claim 38, wherein said clocking time of clock recipients in each of the partitioned groups is defined relative to said clocking time of clock recipients in another of the partitioned groups.

42. An apparatus for synthesizing an electronic circuit description of a system from a technology-independent description of the system comprising:
    a processor for executing stored program instruction steps; and
    a memory connected to the processor for storing the program instruction steps wherein the program instruction steps include:
    partitioning the technology-independent description of the system into partitioned groups based on a clocking time of clock recipients in each of the partitioned groups; and
    generating a clock budgeting plan.

43. An apparatus for synthesizing an electronic circuit description of a system from a technology-independent description of the system comprising:
    a processor for executing stored program instruction steps; and
    a memory connected to the processor for storing the program instruction steps wherein the program instruction steps include:
    partitioning the technology-independent description into partitioned groups based on a clocking time of clock recipients in each of the partitioned groups; and
    generating a clock budgeting plan by assigning each of the partitioned groups to one target timing group based on the clocking time of clock recipients in each of the partitioned groups wherein each target timing group has a corresponding relative clock phase that differs from that of every other target timing group.

44. The apparatus of claim 43, wherein the program instruction steps further include creating a clock distribution network based on the clock budgeting plan, wherein the clock distribution network provides a clock signal to clock recipients in each of the target timing groups in a manner that the clock recipients in each of the target timing groups are clocked together at a substantially same time.

45. The apparatus of claim 43, wherein the program instruction steps further include changing the clocking time of the clock recipients by switching the clock recipients from one target timing group to another target timing group.

46. An ECAD system for synthesizing an electronic circuit description of a system from a technology-independent description of the system comprising:

means for inputting the technology-independent description of the system;

means for partitioning the technology-independent description into partitioned groups based on a clocking time of clock recipients in each of the partitioned groups; and means for generating a clock budgeting plan by assigning each of the partitioned groups to a target timing group based on the clocking time of clock recipients in each of the partitioned groups wherein each target timing group has a corresponding relative clock phase that differs from that of every other target timing group.

47. The ECAD system of claim 46, further comprising:

means for creating a clock distribution network based on the clock budgeting plan, wherein the clock distribution network provides a clock signal to clock recipients in each of the target timing groups in a manner that the clock recipients in each of the target timing groups are clocked together at a substantially same time.

48. A method according to claim 46, wherein said clocking time of clock recipients in each of the partitioned groups is defined relative to said clocking time of clock recipients in another of the partitioned groups.

49. Computer-executable process steps stored on a computer readable medium for synthesizing an electronic circuit description of a system from a technology-independent description of the system comprising:

inputting the technology-independent description of the system;

partitioning the technology-independent description into partition ed groups based on a clocking time of clock recipients in each of the partitioned groups; and generating a clock budgeting plan by assigning each of the partitioned groups to one target timing group based on the clocking time of clock recipients in each of the partitioned groups wherein each target timing group has a corresponding relative clock phase that differs from that of every other target timing group.

50. The computer-executable process steps of claim 49, further comprising creating a clock distribution network based on the clock budgeting plan, wherein the clock distribution network provides a clock signal to clock recipients in each of the target timing groups in a manner that the clock recipients in each of the target timing groups are clocked together at a substantially same time.

51. A method according to claim 49, wherein said clocking time of clock recipients in each of the partitioned groups is defined relative to said clocking time of clock recipients in another of the partitioned groups.

52. Computer-executable process steps stored on a computer readable medium for synthesizing an electronic circuit description of a system from a hardware description language (HDL) description of the system comprising:

inputting the HDL description of the system;

partitioning the HDL description into partitioned groups based on a clocking time of clock recipients in each of the partitioned groups; and generating a clock budgeting plan by assigning each of the partitioned groups to one target timing group based on the clocking time of clock recipients in each of the partitioned groups wherein each target timing group has a corresponding relative clock phase that differs from that of every other target timing group.

53. A method according to claim 52, wherein said clocking time of clock recipients in each of the partitioned groups is defined relative to said clocking time of clock recipients in another of the partitioned groups.

54. A method of designing an electronic circuit having a clock distribution network on an integrated circuit die comprising the following steps:

partitioning a description of the electronic circuit into partitioned groups based on a clocking time of clock recipients in each of the partitioned groups; and generating a clock budgeting plan.

\* \* \* \* \*